United States Patent
Khemka et al.

(10) Patent No.: US 7,439,584 B2
(45) Date of Patent: Oct. 21, 2008

(54) STRUCTURE AND METHOD FOR RESURF LDMOSFET WITH A CURRENT DIVERTER

(75) Inventors: Vishnu K. Khemka, Phoenix, AZ (US); Amitava Bose, Tempe, AZ (US); Todd C. Roggenbauer, Chandler, AZ (US); Ronghua Zhu, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 184 days.

(21) Appl. No.: 11/363,901

(22) Filed: Feb. 28, 2006

(65) Prior Publication Data

US 2006/0261408 A1 Nov. 23, 2006

Related U.S. Application Data

(63) Continuation-in-part of application No. 11/134,792, filed on May 19, 2005.

(51) Int. Cl.
*H01L 29/76* (2006.01)
*H01L 29/94* (2006.01)
(52) U.S. Cl. ..................... 257/341; 357/401
(58) Field of Classification Search ......... 257/341–343, 257/401, 492–493
See application file for complete search history.

(56) References Cited

U.S. PATENT DOCUMENTS

| | | | |
|---|---|---|---|
| 4,963,951 A | 10/1990 | Adler et al. | |
| 5,773,852 A | 6/1998 | Han et al. | |
| 5,801,431 A | 9/1998 | Ranjan | |
| 5,959,332 A * | 9/1999 | Ravanelli et al. | 257/360 |
| 6,100,549 A | 8/2000 | Weitzel et al. | |
| 6,288,424 B1 | 9/2001 | Ludikhuize | |
| 6,374,008 B2 | 4/2002 | Solgaard et al. | |

(Continued)

OTHER PUBLICATIONS

Zhu, R. et al.; "Suppression of substrate injection by RESURF LDMOS devices in a smart power technology for 20-30V applications"; IEEE BCTM; 1998; pp. 184-185; IEEE.

*Primary Examiner*—Theresa T Doan
(74) *Attorney, Agent, or Firm*—Michael J. Balconi-Lamica

(57) ABSTRACT

Methods and apparatus are provided for reducing substrate leakage current of RESURF LDMOSFET devices. A semiconductor device comprises a semiconductor substrate (22) of a first type; first and second terminals (39,63) laterally spaced-apart on a surface (35) above the substrate; a first semiconductor region (32) of the first type overlying the substrate and ohmically coupled to the first terminal (39); a second semiconductor region (48) of a second opposite type in proximity to the first region and ohmically coupled to the first terminal; a third semiconductor region (30) of the second type overlying the substrate and ohmically coupled to the second terminal (63) and laterally arranged with respect to the first region; a parasitic vertical device comprising the first region and the substrate, the parasitic vertical device for permitting leakage current to flow from the first terminal to the substrate; a fourth semiconductor region (62) of the first type in proximity to the third region and ohmically coupled to the second terminal, thereby forming in combination with the third region a shorted base-collector region of a lateral transistor extending between the first and second terminals to provide diode action; a channel region (27) of the first type separating the first and third regions at the surface; a gate insulator (43) overlying the channel region; and a gate electrode (42) overlying the gate insulator.

15 Claims, 4 Drawing Sheets

U.S. PATENT DOCUMENTS

| | | |
|---|---|---|
| 6,573,562 B2 | 6/2003 | Parthasarathy et al. |
| 6,693,339 B1 | 2/2004 | Khemka et al. |
| 6,747,332 B2 | 6/2004 | De Fresart et al. |
| 6,853,033 B2 | 2/2005 | Liang et al. |
| 6,882,023 B2 | 4/2005 | Khemka et al. |
| 6,888,210 B2 | 5/2005 | Jeon et al. |
| 6,909,143 B2 | 6/2005 | Jeon et al. |
| 6,911,696 B2 | 6/2005 | Denison |
| 2004/0084744 A1 | 5/2004 | Khemka et al. |
| 2004/0195644 A1 | 10/2004 | Mallikarjunaswamy et al. |
| 2004/0238913 A1 | 12/2004 | Kwon et al. |
| 2005/0245020 A1 | 11/2005 | Zhu et al. |
| 2006/0246670 A1 | 11/2006 | Khemka et al. |

* cited by examiner

US 7,439,584 B2

STRUCTURE AND METHOD FOR RESURF LDMOSFET WITH A CURRENT DIVERTER

CROSS-REFERENCE TO CO-PENDING APPLICATION

This application is a continuation-in-part of co-pending patent application Ser. No. 11/134,792 filed on May 19, 2005, entitled "Structure and Method For RESURF Diodes With a Current Diverter" to Khemka et al., assigned to the assignee of the present disclosure and incorporated herein by reference.

BACKGROUND

This invention generally relates to Smart Power integrated circuits and, more particularly, to means and methods for reducing substrate leakage currents associated with RESURF LDMOSFETs employed in such integrated circuits.

There are many integrated circuit (IC) applications today which use metal oxide semiconductor field effect transistor (MOSFET) devices, and include structures in connection with RESURF devices. "RESURF" is an abbreviation standing for "reduced surface field." RESURF devices and methods are described for example, in U.S. Pat. Nos. 6,882,023 B2 to Khemka et al and 6,747,332 B2 to de Fresart et al.

The presence of a parasitic NPN transistor in a standard isolated RESURF LDMOSFET causes principal current conduction of the device to go through the N-type buried layer (NBL). A voltage drop (or IR drop) in the NBL can turn-on the NBL/substrate diode. As a result, this requires the LDMOSFET device to be broken up into several small sections with an isolation (ISO) tie to the NBL disposed in between at regular intervals.

Accordingly, there is a need for an improved LDMOSFET method and apparatus for overcoming the problems in the art as discussed above.

BRIEF DESCRIPTION OF THE DRAWINGS

The embodiments of the present disclosure are illustrated by way of example and not limited by the accompanying figures, in which like references indicate similar elements, and in which.

Figure 1:
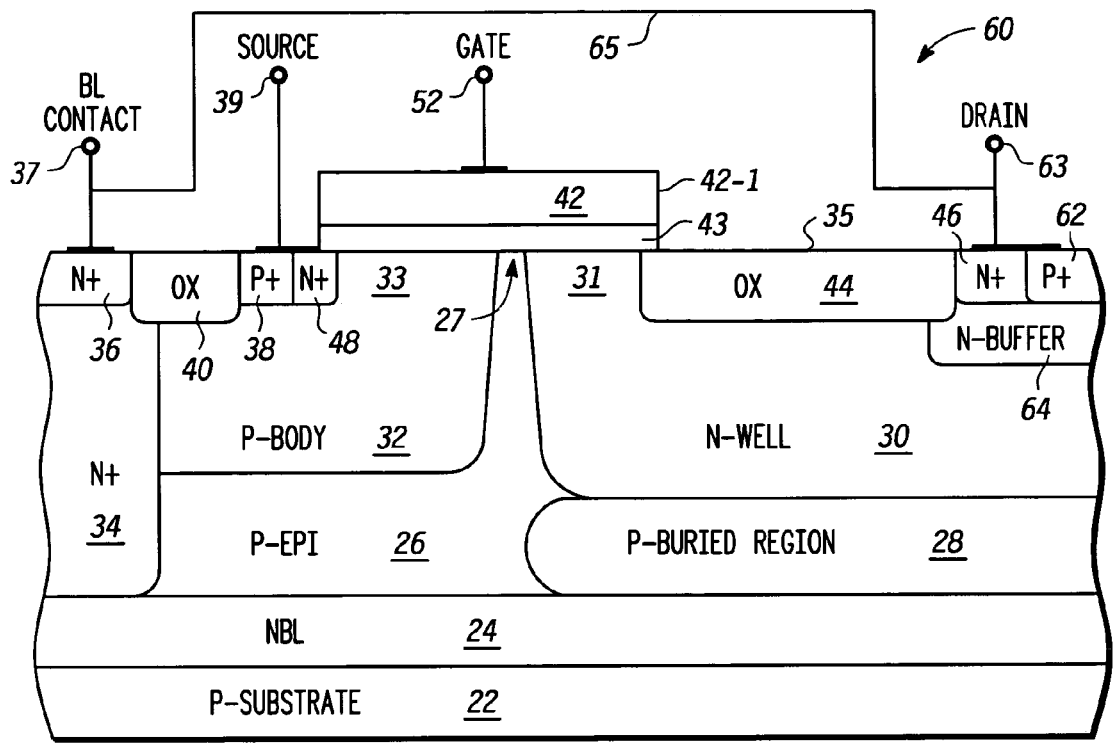
FIG. 1 is a simplified schematic cross-section through a RESURF LDMOSFET device according to an embodiment of the present disclosure.

The use of the same reference symbols in different drawings indicates similar or identical items. Skilled artisans will also appreciate that elements in the figures are illustrated for simplicity and clarity and have not necessarily been drawn to scale. For example, the dimensions of some of the elements in the figures may be exaggerated relative to other elements to help improve the understanding of the embodiments of the present disclosure.

DETAILED DESCRIPTION

The following detailed description is merely exemplary in nature and is not intended to limit the embodiments of the present disclosure or the application and uses of the embodiments. Furthermore, there is no intention to be bound by any expressed or implied theory presented in the preceding background or the following detailed description.

For simplicity and clarity of illustration, the drawing figures illustrate the general manner of construction, and descriptions and details of well-known features and techniques may be omitted to avoid unnecessarily obscuring the embodiments of the present disclosure. Additionally, elements in the drawings figures are not necessarily drawn to scale. For example, the dimensions of some of the elements or regions in the figures may be exaggerated relative to other elements or regions to help improve understanding of embodiments of the present disclosure.

The terms "first," "second," "third," "fourth" and the like in the description and the claims, if any, are used for distinguishing between similar elements and not necessarily for describing a particular sequential or chronological order. It is to be understood that the terms so used are interchangeable under appropriate circumstances such that the embodiments of the present disclosure described herein are, for example, capable of operation in sequences other than those illustrated or otherwise described herein. Furthermore, the terms "comprise," "include," "have" and any variations thereof, are intended to cover non-exclusive inclusions, such that a process, method, article, or apparatus that comprises a list of elements is not necessarily limited to those elements, but may include other elements not expressly listed or inherent to such process, method, article, or apparatus.

The terms "left," "right," "front," "back," "up," "down," "top," "bottom," "over," "under," "above," "below" and the like in the description and the claims, if any, are used for descriptive purposes and not necessarily for describing permanent relative positions. It is to be understood that the terms so used are interchangeable under appropriate circumstances such that embodiments of the present disclosure described herein are, for example, capable of operation in other orientations than those illustrated or otherwise described herein. The term "coupled," as used herein, is defined as directly or indirectly connected in an electrical or non-electrical manner.

FIG. 1 is a simplified schematic cross-section through RESURF LDMOSFET device 60 according to an embodiment of the present disclosure. RESURF LDMOSFET device 60 comprises P-type substrate 22, N-type buried layer (NBL) 24 overlying substrate 22, P-epi region 26 overlying NBL 24, P-buried region 28 typically implanted within P-epi region 26, N-well region 30 located between P-buried region 28 and surface 35, P-body region 32 extending into P-epi region 26 from surface 35 and laterally separated from N-well region 30 by channel region 27, N+ sinker region 34 extending from surface 35 through P-epi region 26 to NBL 24, N+ contact region 36 at surface 35 in N+ sinker region 34 for making contact to NBL 24 via N+ sinker region 34, P+ (e.g., source) region 38 in P-body region 32 laterally separated from N+ contact region 36 by oxide (OX) isolation region 40, N+ region 48 at surface 35 in P-body region 32 laterally adjacent P+ region 38, MOS gate 42 located over surface 35 above portion 33 of P-body region 32 extending laterally substantially from a portion of N+ region 48 across channel region 27 and portion 31 of N-well region 30 and separated there from by thin gate oxide 43 on surface 35. Isolation oxide (OX) region 44 is provided extending downward from surface 35 into N-well region 30 and laterally extending approximately from edge 42-1 of gate 42 to N+ region 46 and P+ region 64 in N-well region 30 at surface 35.

Connection 39 to P+ region 38 and N+ region 48 forms the source contact of RESURF LDMOSFET device 60. Connection 39 comically couples P+ region 38 and N+ region 48. Connection 63 to N+ region 46 and P+ region 62 forms the drain contact of RESURF LDMOSFET device 60. Connection 63 comically couples N+ region 46 and P+ region 62. Connection 65 is desirably but not essentially provided to short N+ BL contact region 36 to drain connection 63. Ohmic contacts are conveniently made to regions 36, 38, 46 and 62 using cobalt silicate, but other materials well known in the art may also be used. Various conductors, as for example and not intended to be limiting, Ti, TiN, W are applied to the cobalt-silicate holmic contacts to form connection 63 and the other connections and interconnection (e.g., 37, 39, 65). How to make holmic contact to and provide connections to and interconnections between various regions of semiconductor devices is well known in the art.

Figure 2:
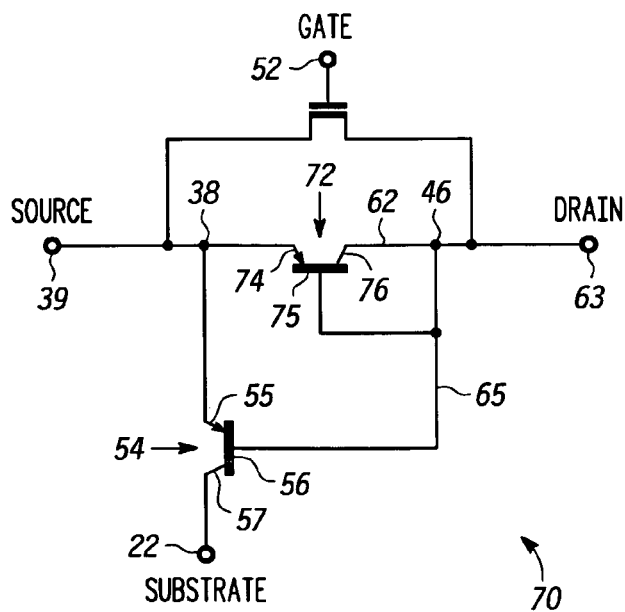
FIG. 2 is a simplified electrical equivalent circuit of the LDMOSFET device of FIG. 1.

Device 60 of FIG. 1 includes N+ region 48 adjacent to or in proximity of P+ region 38 and comically coupled thereto via connection 39. Inclusion of N+ region 48 creates the desired LDMOSFET device 52 as shown in FIG. 2. N+ region 48 is coupled to P+ region 38, forming the emitter 74 of the base-collector shorted PNP device 72 (e.g., see FIG. 2), to improve the robustness or safe-operating-area (SOA) of the LDMOSFET which is well known in the art. Since provision of N+ regions (e.g., by ion implantation) is already incorporated in the manufacturing process flow (e.g., for providing N+ region 46) only a mask layer change is needed to include N+ region 48 and no new additional process steps are required. Similarly, the cobalt silicate used for holmic contact to regions 36, 38, 46 also serves to provide holmic contact to region 48. Connection 39 provides a substantially shorting contact to both P+ region 38 and N+ region 48. This is also accomplished merely by a mask layer change without additional processing steps. The lateral arrangement of regions 38 and 48 can not be interchanged as formation of MOSFET 52 (see FIG. 2) depends on it. Furthermore, it is possible to create a working device by laterally separating the two regions 38 and 48; however, such an arrangement can possibly degrade the SOA of the device.

Device 60 of FIG. 1 further includes P+ region 62 adjacent to or in proximity of N+ region 46 and comically coupled thereto via connection 63. P+ region 62 coupled to N+ region 46 creates a base-collector shorted PNP device from source 39 to drain 63 (e.g., see FIG. 2). Since provision of P+ regions (e.g., by ion implantation) is already incorporated in the manufacturing process flow (e.g., for providing P+ region 38) only a mask layer change is needed to include P+ region 62 and no new additional process steps are required. Similarly, the cobalt silicate used for holmic contact to regions 36, 38, 46 also serves to provide holmic contact to region 62. Connection 63 provides a substantially shorting contact to both N+ region 46 and P+ region 62. This is also accomplished merely by a mask layer change without additional processing steps. While P+ region 62 is shown in FIG. 1 (and subsequent figures) as being located adjacent N+ region 46, on an opposite side of oxide isolation region 44, this is merely for convenience of explanation and not intended to be limiting. The lateral arrangement of regions 62, 46 can be interchanged or they can be laterally separated provided that they are substantially shorted together by connection 63 so as to provide a base-collector shorted PNP device 72 of FIGS. 1-2. However, in the case where P+ region 62 is located in between the oxide region 44 and N+ region 46, the normal operation of device might degrade through parasitic latch-up.

FIG. 2 is simplified electrical equivalent circuit 70 of LDMOSFET device 60 of FIG. 1. Equivalent circuit 70 comprises parasitic PNP transistor 54 inherently present in RESURF LDMOSFET device 60, and shorted base-collector PNP device 72 extending between source 39 and drain 63. PNP device 72 comprises emitter 74 formed by P+ contact region 38, P-body 32 and P-epi region 26, base 75 formed by N-well region 30 and N+ contact region 46, and collector 76 formed by P+ region 62. With optional connection 65, base 75 is also formed by NBL 24, N+ sinker region 34 and N+ contact 36 coupled to N+ region 64. Connection 63 shorts base 75 and collector 76 together. An advantage of this arrangement is that base-collector shorted device 72 has gain so that the current flowing from source 39 to drain 63 through device 72 for a given source-drain bias increases relative to the current flowing to substrate 22 through parasitic device 54 (e.g., see FIG. 11). Thus, the performance of LDMOSFET device 60 of FIG. 1 is improved relative to prior art devices.

Optional N-buffer region 64 is desirably provided in N-well 30 of device 60 underlying N+ region 46 and P+ region 62. N-buffer region 64 is conveniently doped more heavily than N-well region 30 and less heavily than N+ contact. N-buffer region 64 is desirable for punch-through mitigation or prevention. The inclusion of N-buffer region 64 may require an additional masking layer from the point of view of the device of FIG. 1 alone. However, an implant appropriate for providing N-buffer region 64 is often readily available in power IC technologies where it may be needed for other devices being manufactured on the same substrate at the same time as the device according to the embodiments of the present disclosure and can, therefore, be included for this device with only a mask layer modification and without an additional step in the overall process.

Figure 3:
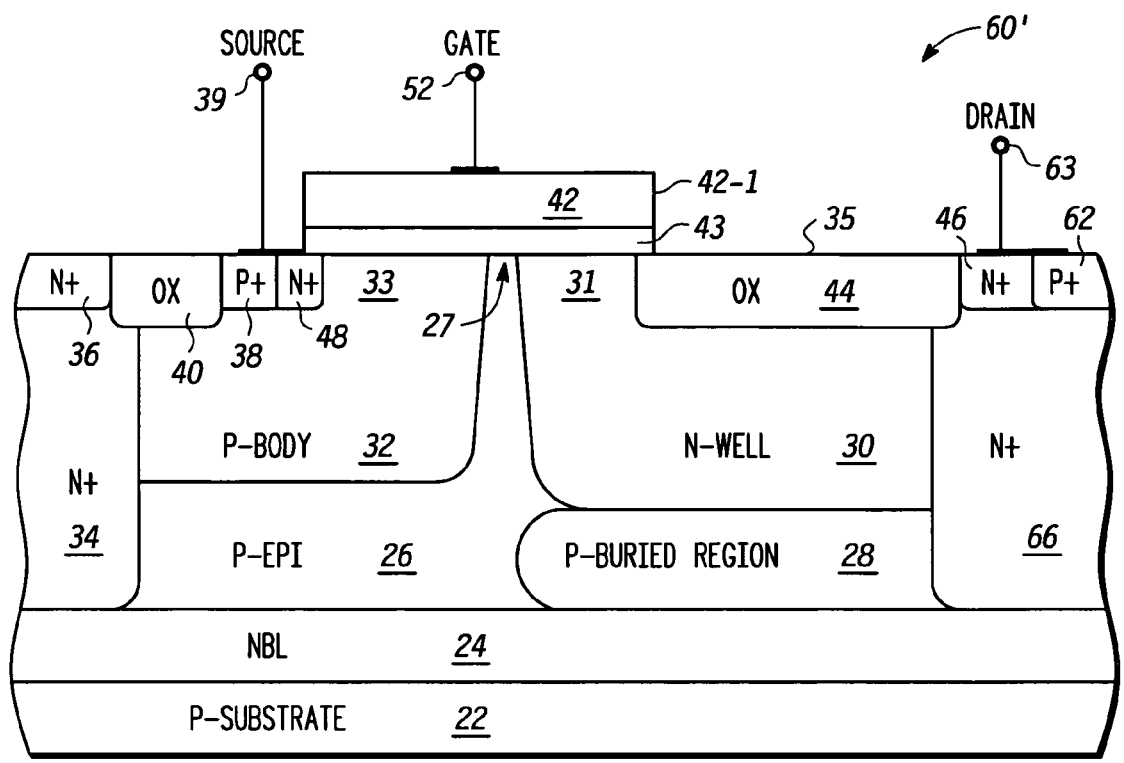
FIG. 3 is a simplified schematic cross-section through a RESURF LDMOSFET device according to another embodiment of the present disclosure.

FIG. 3 is a simplified schematic cross-section through RESURF LDMOSFET device 60' analogous to device 60 of FIG. 1 but according to another embodiment of the present disclosure. The device of FIG. 3 has a simplified electrical equivalent circuit similar to that of the device of FIG. 1, analogous to equivalent circuit 70 of FIG. 2. Devices 60 and 60' differ in that connection 65 of FIG. 1 tying N+ BL contact region 36 to drain regions 46,62 is omitted and N+ sinker region 66 is provided so that NBL 24 is tied to drain regions 46, 62 via N+ sinker region 66 rather than via connection 65. The operation of LDMOSFET device 60' and its equivalent circuit (not shown) is substantially the same as for device 60 and circuit 70 with connection 65. The arrangement of FIG. 3 is convenient in that connection 65 is not required. N+ sinker region 66 is conveniently provided at the same time as or in place of N+ sinker region 34 and only a mask change is needed. N-Buffer region 64 is conveniently omitted in the arrangement of FIG. 3 since N+ sinker 66 inherently provides punch-through protection. Furthermore, additional chip area is not needed.

Figure 4:
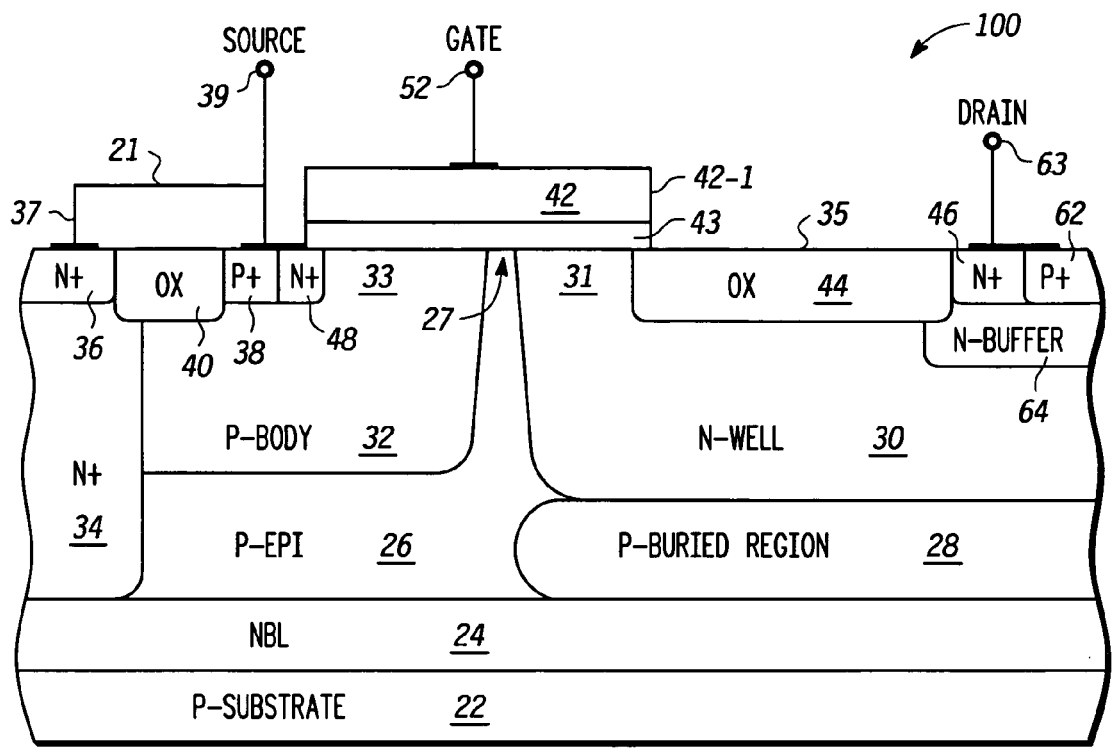
FIG. 4 is a simplified schematic cross-section through a RESURF LDMOSFET device according to yet another embodiment of the present disclosure.
Figure 5:
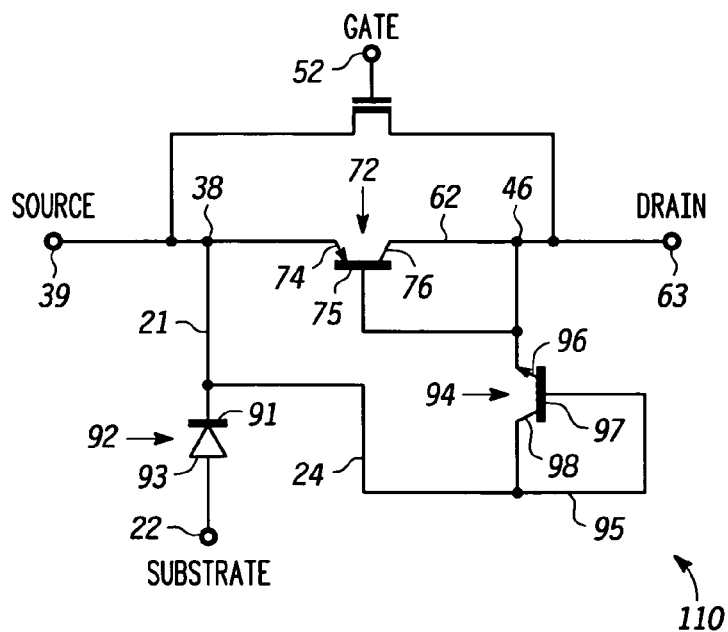
FIG. 5 is a simplified electrical equivalent circuit of the LDMOSFET device of FIG. 4.

FIG. 4 is a simplified schematic cross-section through RESURF LDMOSFET device 100 analogous to devices 60, 60' of FIGS. 1, 3 but according to yet another embodiment of the present disclosure, and FIG. 5 is simplified electrical equivalent circuit 110 analogous to equivalent circuit 70 of FIG. 2, but of the LDMOSFET device of FIG. 4. Device 100 of FIG. 4 differs from device 60 of FIG. 1 in that connection 21 is provided between P+ source region 38 and N+ buried layer contact region 36. In other words, connection 21 between source 39 and N+ buried layer contact region 36 is included in device 100. In other respects, the configuration of device 100 is substantially similar to the configuration of device 60.

As shown by equivalent circuit 110 of FIG. 5, PNP transistor 72 exists between source 39 and drain 63 of device 100, just as for device 60. However, the presence of connection 21 shorting source 39 comprising gate 42 and P+ region 38 to N-type BL 24 via N+ contact region 36 and N+ sinker region 34, has the effect of creating parasitic NPN transistor 94 between source 39 and drain 63. Emitter 96 is provided by N-well 30 and N+ region 46, base 97 is provided by P+ contact region 38, P+ body region 32, P-epi region 26 and P-buried region 28, and collector 98 is provide by the combination of N-type BL 24, N+ sinker 34 and N+ region 36. The presence of parasitic NPN 94 causes a substantial part of the source-drain current to flow through buried layer 24. The voltage drop in buried layer 24 can turn on substrate diode 92, thereby increasing the leakage current to substrate 22. In the prior art, this problem has generally been mitigated by breaking up the device into several smaller sections with an isolation tie to N-type buried layer 24 disposed in between at regular intervals, which undesirably consumes additional device area, resulting in increased die cost for the same performance. However, this problem is mitigated by the arrangement according to the embodiment as shown in FIGS. 4 and 5.

As shown in FIG. 5, parasitic NPN transistor 94 exists for the reason as explained above. According to one embodiment of the present disclosure, LDMOSFET device 100 of FIG. 4 includes P+ region 62 in N-well region 30 in the same manner as already described in connection with device 60 of FIG. 1. Optional N-buffer region 64 may also be included but this is not essential. As shown by equivalent circuit 110 of FIG. 5 and as previously explained in connection with the discussion of circuit 70 of FIG. 2, including P+ region 62 creates base-collector shorted PNP transistor 72 between source 39 and drain 63. The gain inherent in PNP transistor 72 increases the proportion of source-drain current that flows through device 72 relative to that flowing via parasitic NPN device 94, with the consequence that the biasing effect of the lateral voltage drop in N-type BL 24 is reduced and less current passes through diode 92 to substrate 22. Thus, the performance of RESURF LDMOSFET device 100 is improved compared to prior art devices.

Figure 6:
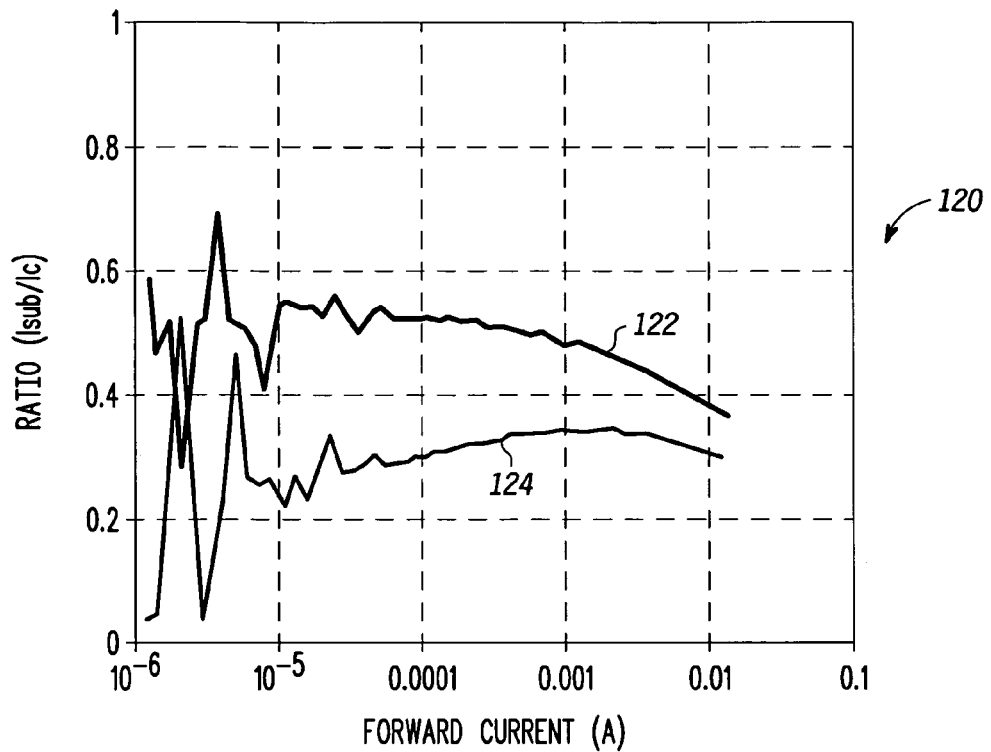
FIG. 6 shows plots as a function of forward current of the ratio of substrate current (Isub) to diode current (Ic) for LDMOSFET devices of the prior art and the embodiments of the present disclosure of the type illustrated in FIGS. 1 and 3.

FIG. 6 shows plot 120 as a function of forward current of the ratio of substrate current (Isub) to diode current (Ic) for LDMOSFET devices of the prior art and of the embodiments of the present disclosure. Trace 122 is the ratio (Isub)/(Ic) for a prior art device and trace 124 is the ratio (Isub)/(Ic) for a device according to the embodiments of the present disclosure of the type illustrated in FIGS. 1-2 and 3. It will be noted that for substantially all values of forward current, the device according to the embodiments of the present disclosure has lower substrate current indicating that it significantly improves overall performance.

Figure 7:
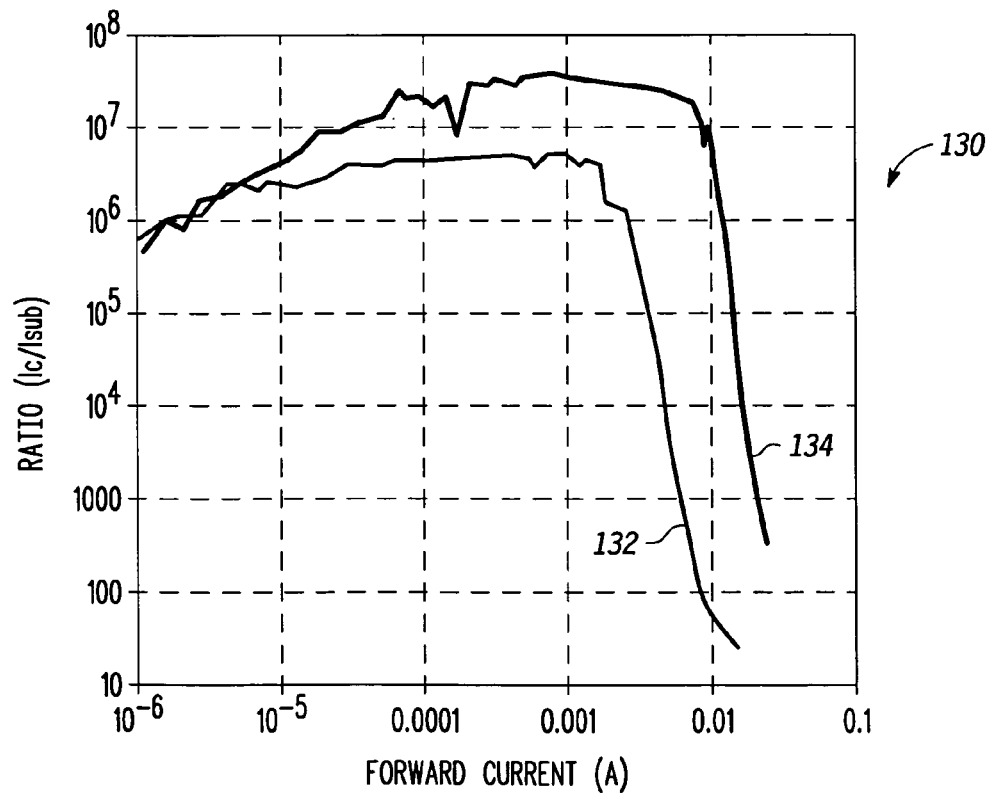
FIG. 7 shows plots as a function of forward current of the ratio of diode current (Ic) to substrate current (Isub) for LDMOSFET devices of the prior art and the embodiment of the type illustrated in FIG. 4.

FIG. 7 shows plot 130 as a function of forward current of the ratio of diode current (Ic) to substrate current (Isub) for LDMOSFET devices of the prior art and of the embodiments of the present disclosure. Trace 132 is the ratio (Ic)/(Isub) for a prior art device and trace 134 is the ratio (Ic)/(Isub) for a device according to the embodiments of the present disclosure of the type illustrated in FIGS. 4-5. It will be noted that for substantially all values of forward current, the device according to the embodiments of the present disclosure has higher diode current (lower substrate current) indicating that it significantly improves overall performance.

While the exemplary embodiments of invention have been described for a RESURF LDMOSFET structure based on NMOSFET, this is merely for convenience of explanation and not intended to be limiting and the invention is also applicable to RESURF LDMOSFET structures based on PMOSFET. For example, and not intended to be limiting, each N and P-type region may be replaced with its equivalent of opposite conductivity type, with corresponding changes in the polarity of applied voltages and equivalent circuit elements. The principles taught by the embodiments of the present disclosure apply to such an arrangement. The embodiments of the present disclosure provide an additional region of the appropriate conductivity type to create a collector-base shorted transistor functioning as or in place of a diode extending between source and drain, irrespective of whether the diode is a PN diode (as described above) or an NP diode obtained by swapping the N and P regions. Replacing the diode with a shorted base-collector transistor provides gain which increases the current flowing between source and drain relative to the parasitic current flowing into the substrate. It will also be apparent based on the description herein that the various device regions described herein and identified in various illustrative embodiments as being P-type and N-type regions may be more generally referred to as being regions of a first conductivity type and regions of a second conductivity type different than the first conductivity type, where such regions may be either N or P-type.

Stated another way and in more general terms, the embodiments of the present disclosure provide the equivalent of a lateral MOSFET device between first and second surface terminals on a semiconductor substrate where a vertical parasitic device also exists that permits leakage current to flow from the first terminal of the LDMOSFET device to the substrate, which leakage current is reduced by having the second terminal of the LDMOSFET device comprise both N and P type regions coupled together by the second terminal. This arrangement forms a shorted base-collector lateral transistor acting as the diode between the first and second terminals, which lateral transistor has gain, thereby increasing the proportion of the current entering the first terminal that flows to the second terminal. In a preferred embodiment, the second terminal is also coupled to a buried layer that overlies the substrate beneath the shorted base-collector lateral transistor, either by a surface lead to a buried layer contact or by providing a doped region of the same conductivity type as the buried layer extending between the N or P region of the second terminal and the buried layer. The embodiments of the present disclosure also improve performance where the source contact of the LDMOSFET device (e.g., its source) is comically coupled to the buried layer contact.

There is provided a method a method of making a lateral diode function on a substrate of a first conductivity type, comprising, in any order, forming a buried layer of a second conductivity type different than the first conductivity type in contact with the substrate, depositing an epi layer of the first conductivity type located in contact with the buried layer and having a first surface opposite the buried layer, doping a body region of the first conductivity type in the epi-layer, doping a well region of the second conductivity type in the epi-layer laterally spaced apart from the body region by a channel region, providing a first contact region of the first conductivity type in the body region, providing a second contact region of the second conductivity type in the body region proximate the first contact region, providing a third contact region of the second conductivity type in the well region, providing a fourth contact region of the first conductivity type in the well region proximate the second contact region, forming a gate insulated from and overlying the surface and the channel region, making a first holmic connection to the first and second contact regions, making a second holmic connection to the third and fourth contact regions, and making a third holmic connection to the gate. In one embodiment, the steps of providing the first and fourth contact regions are carried out substantially simultaneously. In another embodiment, the steps of providing the second and third contact regions are carried out substantially simultaneously. In another embodiment, the first conductivity type comprises p-type and the second conductivity type comprises n-type. In a further exemplary embodiment, the method comprises providing a contact sinker through the epi-layer for making contact with the buried layer. A connection from the buried layer contact to either the first or second holmic connections is desirably provided. The body region, well region, contact regions and sinker region are conveniently but not essentially provided by ion implantation. The buried layer may be formed by ion implantation or any other convenient means.

According to one embodiment, a semiconductor device comprises a semiconductor substrate of a first conductivity type, and first and second terminals laterally spaced-apart on a surface above the semiconductor substrate. A first semiconductor region of the first conductivity type overlies the substrate and comically couples to the first terminal. A second semiconductor region of a second opposite conductivity type is in proximity to the first semiconductor region and comically coupled to the first terminal. A third semiconductor region of the second conductivity type overlies the substrate and comically couples to the second terminal and is laterally arranged with respect to the first semiconductor region. The semiconductor device further includes a parasitic vertical device comprising the first semiconductor region and the substrate, the parasitic vertical device for permitting leakage current to flow from the first terminal to the substrate. A fourth semiconductor region of the first conductivity type is in proximity to the third semiconductor region and comically coupled to the second terminal, thereby forming in combination with the third semiconductor region a shorted base-collector region of a lateral transistor extending between the first and second terminals to provide diode action. A channel region of the first conductivity type separates the first and third regions at the surface. A gate insulator overlies the channel region and a gate electrode overlies the gate insulator.

In another embodiment, the device further comprises a third terminal comically coupled to the gate electrode. The device can further comprise a buried layer of the second conductivity type located between the substrate and the first, second, third and fourth semiconductor regions, and a buried layer contact region of the second conductivity type extending from the buried layer to the surface to permit electrical contact to the buried layer. In another embodiment, the device includes an holmic connection extending between the second terminal and the buried layer contact region. In yet another embodiment, the device further includes an holmic connection extending between the first terminal and the buried layer contact region. Still further, in another embodiment, the device further comprises a buried layer of the second conductivity type located between the substrate and the first, second, third and fourth semiconductor regions, and a buried layer contact region of the second conductivity type extending from the buried layer to the fourth semiconductor region. In another embodiment, the device further comprises a fifth semiconductor region of the second conductivity type, more lightly doped than the third semiconductor region and underlying the fourth semiconductor region.

In another embodiment, the first semiconductor region of the first conductivity type comprises a first highly doped contact region comically coupled to the first terminal and a less highly doped body region of the first conductivity type underlying the first highly doped contact region, the second semiconductor region of the second conductivity type comprises a second highly doped contact region comically coupled to the first terminal and adjacent to the first highly doped contact region, the third semiconductor region of the second conductivity type comprises a third highly doped contact region comically coupled to the second terminal and a less highly doped well region of the second conductivity type underlying the third highly doped contact region, and the fourth semiconductor region of the first conductivity type comprises a fourth highly doped contact region comically coupled to the second terminal and adjacent to the third highly doped contact region. Still further, the third highly doped contact region is positioned in-between the second highly doped contact region and the fourth highly doped contact region. Yet still further, the device further comprises a buffer region of the second conductivity type underlying the third and fourth highly doped contact regions and extending into the well region, and more highly doped than the well region.

In a still further embodiment, the third semiconductor region of the second conductivity type comprises a first highly doped contact region comically coupled to the second terminal and a less highly doped well region of the second conductivity type underlying the first highly doped contact region, the device further comprising a buried region of the first conductivity type located between the buried layer of the second conductivity type and the less highly doped well region of the second conductivity type.

The embodiments of the present disclosure also include a lateral MOSFET device for providing diode action on a semiconductor substrate of a first conductivity type. The device comprise a buried layer of a second conductivity type different than the first conductivity type overlying the substrate, further semiconductor regions overlying the buried layer and having a surface spaced apart from the buried layer, a first contact region of the first conductivity type in the further semiconductor regions overlying the buried layer and extending to the surface, a second contact region of the second conductivity type in the further semiconductor regions overlying the buried layer, adjacent the first contact region, and extending to the surface, a third contact region of the second conductivity type in the further semiconductor regions overlying the buried later, laterally disposed with respect to the first and second contact regions, and extending to the surface, a first terminal comically coupled to the first and second contact regions, a second terminal comically coupled to the third contact region, a vertical parasitic device embodying the first contact region, a portion of the further semiconductor regions and the substrate, whereby the parasitic device is adapted to provide a leakage current path to the substrate from the first terminal when bias is applied between the first and second terminals, a fourth contact region of the first conductivity type in the further semiconductor regions in proximity to the third contact region and comically coupled thereto and to the second terminal, thereby forming in cooperation with the third contact region a shorted base-collector region of a lateral transistor extending between the first and second terminals and adapted to provide diode action in response to a bias applied between the first and second terminals, wherein the further semiconductor regions comprise (I) a body region of the first conductivity type including the first and second contact regions, and (ii) a well region of the second conductivity type including the third and fourth contact regions and laterally separated from the body region at the surface, and a gate insulated from the surface and overlying a channel region separating the body region and the well region at the surface.

In the embodiments of the immediately previous paragraph, the device further comprises a buried layer contact region of the same conductivity type as the buried layer, extending through the further semiconductor regions from the buried layer toward the surface. The buried layer contact region underlies and makes contact at least with the third contact region. Furthermore, an holmic connection is located on or above the surface and coupling the buried layer contact region to the third contact region. The device further comprises an holmic connection located on or above the surface and coupling the buried layer contact region to the first contact region.

According to one embodiment of the present disclosure, introducing a P+ diverter converts the body/drain diode into a PNP transistor with base/collector shorted. This causes the diode current to increase due to the bipolar gain for a given bias. In other words, for a fixed input current, less current will go through the parasitic NPN transistor and hence the requisite IR drop to turn-on the NBL/substrate diode is difficult to achieve.

In the foregoing specification, the disclosure has been described with reference to the various embodiments. However, one of ordinary skill in the art appreciates that various modifications and changes can be made without departing from the scope of the present embodiments as set forth in the claims below. Accordingly, the specification and figures are to be regarded in an illustrative rather than a restrictive sense, and all such modifications are intended to be included within the scope of the present embodiments. The embodiments of the present disclosure still further comprise an integrated circuit that includes the LDMOSFETs as discussed herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the term "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A semiconductor device, comprising:
a semiconductor substrate of a first conductivity type;
first and second terminals laterally spaced-apart on a surface above the semiconductor substrate;
a first semiconductor region of the first conductivity type overlying the substrate and ohmically coupled to the first terminal;
a second semiconductor region of a second opposite conductivity type in proximity to the first semiconductor region and ohmically coupled to the first terminal;
a third semiconductor region of the second conductivity type overlying the substrate and ohmically coupled to the second terminal and laterally arranged with respect to the first semiconductor region;
a parasitic vertical device comprising the first semiconductor region and the substrate, the parasitic vertical device for permitting leakage current to flow from the first terminal to the substrate;
a fourth semiconductor region of the first conductivity type in proximity to the third semiconductor region and ohmically coupled to the second terminal, thereby forming in combination with the third semiconductor region a shorted base-collector region of a lateral transistor extending between the first and second terminals to provide diode action;
a channel region of the first conductivity type separating the first and third regions at the surface;
a gate insulator overlying the channel region;
a gate electrode overlying the gate insulator;
a buried layer of the second conductivity type located between the substrate and the first, second, third and fourth semiconductor regions; and
a buried layer contact region of the second conductivity type extending from the buried layer to the fourth semiconductor region.

2. The device of claim 1 further comprising:
a third terminal ohmically coupled to the gate electrode.

3. The device of claim 1, further comprising:
a fifth semiconductor region of the second conductivity type, more lightly doped than the third semiconductor region and underlying the fourth semiconductor region.

4. A semiconductor device, comprising:
a semiconductor substrate of a first conductivity type;
first and second terminals laterally spaced-apart on a surface above the semiconductor substrate;
a first semiconductor region of the first conductivity type overlying the substrate and ohmically coupled to the first terminal;
a second semiconductor region of a second opposite conductivity type in proximity to the first semiconductor region and ohmically coupled to the first terminal;
a third semiconductor region of the second conductivity type overlying the substrate and ohmically coupled to the second terminal and laterally arranged with respect to the first semiconductor region;
a parasitic vertical device comprising the first semiconductor region and the substrate, the parasitic vertical device for permitting leakage current to flow from the first terminal to the substrate;
a fourth semiconductor region of the first conductivity type in proximity to the third semiconductor region and ohmically coupled to the second terminal, thereby forming in combination with the third semiconductor region a shorted base-collector region of a lateral transistor extending between the first and second terminals to provide diode action;
a channel region of the first conductivity type separating the first and third regions at the surface;
a gate insulator overlying the channel region;
a gate electrode overlying the gate insulator;
a buried layer of the second conductivity type located between the substrate and the first, second, third and fourth semiconductor regions; and
a buried layer contact region of the second conductivity type extending from the buried layer to the surface to permit electrical contact to the buried layer.

5. The device of claim 4, further comprising:
an ohmic connection extending between the second terminal and the buried layer contact region.

6. The device of claim 5, wherein:
the third semiconductor region of the second conductivity type comprises a first highly doped contact region ohmically coupled to the second terminal and a less highly doped well region of the second conductivity type underlying the first highly doped contact region, the device further comprising:
a buried region of the first conductivity type located between the buried layer of the second conductivity type and the less highly doped well region of the second conductivity type.

7. The device of claim 4, further comprising:
an ohmic connection extending between the first terminal and the buried layer contact region.

8. The device of claim 4, wherein the buried layer contact region comprises a buried layer contact region of the second conductivity type extending from the buried layer to the fourth semiconductor region.

9. A semiconductor device, comprising:
a semiconductor substrate of a first conductivity type;
first and second terminals laterally spaced-apart on a surface above the semiconductor substrate;
a first semiconductor region of the first conductivity type overlying the substrate and ohmically coupled to the first terminal;
a second semiconductor region of a second opposite conductivity type in proximity to the first semiconductor region and ohmically coupled to the first terminal;
a third semiconductor region of the second conductivity type overlying the substrate and ohmically coupled to the second terminal and laterally arranged with respect to the first semiconductor region;
a parasitic vertical device comprising the first semiconductor region and the substrate, the parasitic vertical device for permitting leakage current to flow from the first terminal to the substrate;
a fourth semiconductor region of the first conductivity type in proximity to the third semiconductor region and ohmically coupled to the second terminal, thereby forming in combination with the third semiconductor region a shorted base-collector region of a lateral transistor extending between the first and second terminals to provide diode action;
a channel region of the first conductivity type separating the first and third regions at the surface;
a gate insulator overlying the channel region; and
a gate electrode overlying the gate insulator, wherein:
the first semiconductor region of the first conductivity type comprises a first highly doped contact region ohmically coupled to the first terminal and a less highly doped body region of the first conductivity type underlying the first highly doped contact region;
the second semiconductor region of the second conductivity type comprises a second highly doped contact region ohmically coupled to the first terminal and adjacent to the first highly doped contact region;
the third semiconductor region of the second conductivity type comprises a third highly doped contact region ohmically coupled to the second terminal and a less highly doped well region of the second conductivity type underlying the third highly doped contact region; and
the fourth semiconductor region of the first conductivity type comprises a fourth highly doped contact region ohmically coupled to the second terminal and adjacent to the third highly doped contact region.

10. The device of claim 9, wherein the third highly doped contact region is positioned in-between the second highly doped contact region and the fourth highly doped contact region.

11. The device of claim 9, further comprising:
a buffer region of the second conductivity type underlying the third and fourth highly doped contact regions and extending into the well region, and more highly doped than the well region.

12. A lateral MOSFET device for providing diode action on a semiconductor substrate of a first conductivity type, comprising:
a buried layer of a second conductivity type different than the first conductivity type overlying the substrate;
further semiconductor regions overlying the buried layer and having a surface spaced apart from the buried layer;
a first contact region of the first conductivity type in the further semiconductor regions overlying the buried layer and extending to the surface;
a second contact region of the second conductivity type in the further semiconductor regions overlying the buried layer, adjacent the first contact region, and extending to the surface;
a third contact region of the second conductivity type in the further semiconductor regions overlying the buried later, laterally disposed with respect to the first and second contact regions, and extending to the surface;
a first terminal ohmically coupled to the first and second contact regions;
a second terminal ohmically coupled to the third contact region;
a vertical parasitic device embodying the first contact region, a portion of the further semiconductor regions and the substrate, whereby the parasitic device is adapted to provide a leakage current oath to the substrate from the first terminal when bias is applied between the first and second terminals;
a fourth contact region of the first conductivity type in the further semiconductor regions in proximity to the third contact region and ohmically coupled thereto and to the second terminal, thereby forming in cooperation with the third contact region a shorted base-collector region of a lateral transistor extending between the first and second terminals and adapted to provide diode action in response to a bias applied between the first and second terminals, wherein the further semiconductor regions comprise (i) a body region of the first conductivity type including the first and second contact regions, and (ii) a well region of the second conductivity type including the third and fourth contact regions and laterally separated from the body region at the surface; and
a gate insulated from the surface and overlying a channel region separating the body region and the well region at the surface, further comprising:
a buried layer contact region of the same conductivity type as the buried layer, extending through the further semiconductor regions from the buried layer toward the surface.

13. The device of claim 12, wherein the buried layer contact region underlies and makes contact at least with the third contact region.

14. The device of claim 12, further comprising:
an ohmic connection located on or above the surface and coupling the buried layer contact region to the third contact region.

15. The device of claim 12, further comprising:
an ohmic connection located on or above the surface and coupling the buried layer contact region to the first contact region.

* * * * *